United States Patent [19]

Krambeck et al.

[11] 4,051,505

[45] Sept. 27, 1977

[54] TWO-DIMENSIONAL TRANSFER IN CHARGE TRANSFER DEVICE

[75] Inventors: Robert Harold Krambeck, South Plainfield; Carlo Heinrich Sequin, Summit; Robert Henry Walden, Warren, all of N.J.

[73] Assignee: Bell Telephone Laboratories, Incorporated, Murray Hill, N.J.

[21] Appl. No.: 342,173

[22] Filed: Mar. 16, 1973

[51] Int. Cl.$^2$ .......................................... H01L 29/78
[52] U.S. Cl. .................................................. 357/24
[58] Field of Search ..................... 317/235 G; 357/24

[56] References Cited

U.S. PATENT DOCUMENTS

| 3,720,922 | 3/1973 | Kosonocky ........................... 317/235 |
| 3,789,267 | 1/1974 | Krambeck et al. ............... 317/235 R |
| Re. 27,775 | 10/1971 | Lehovec ........................... 317/235 R |

FOREIGN PATENT DOCUMENTS 2,121,869  8/1972  France ............................... 317/235

Primary Examiner—Edward J. Wojciechowicz
Attorney, Agent, or Firm—Lester H. Birnbaum

[57] ABSTRACT

Charge transfer devices which permit movement of charge carriers in two noncollinear directions in the surface plane of the device. A network of electrodes in two levels of metallization is combined with an appropriate doping of the storage medium to define the charge transfer paths. The direction of charge transfer is determined by an appropriate pulsing of the network which may take the form of different driving sequences of a number of phases in various embodiments. This concept may be used for both charge coupled and bucket brigade devices.

11 Claims, 26 Drawing Figures

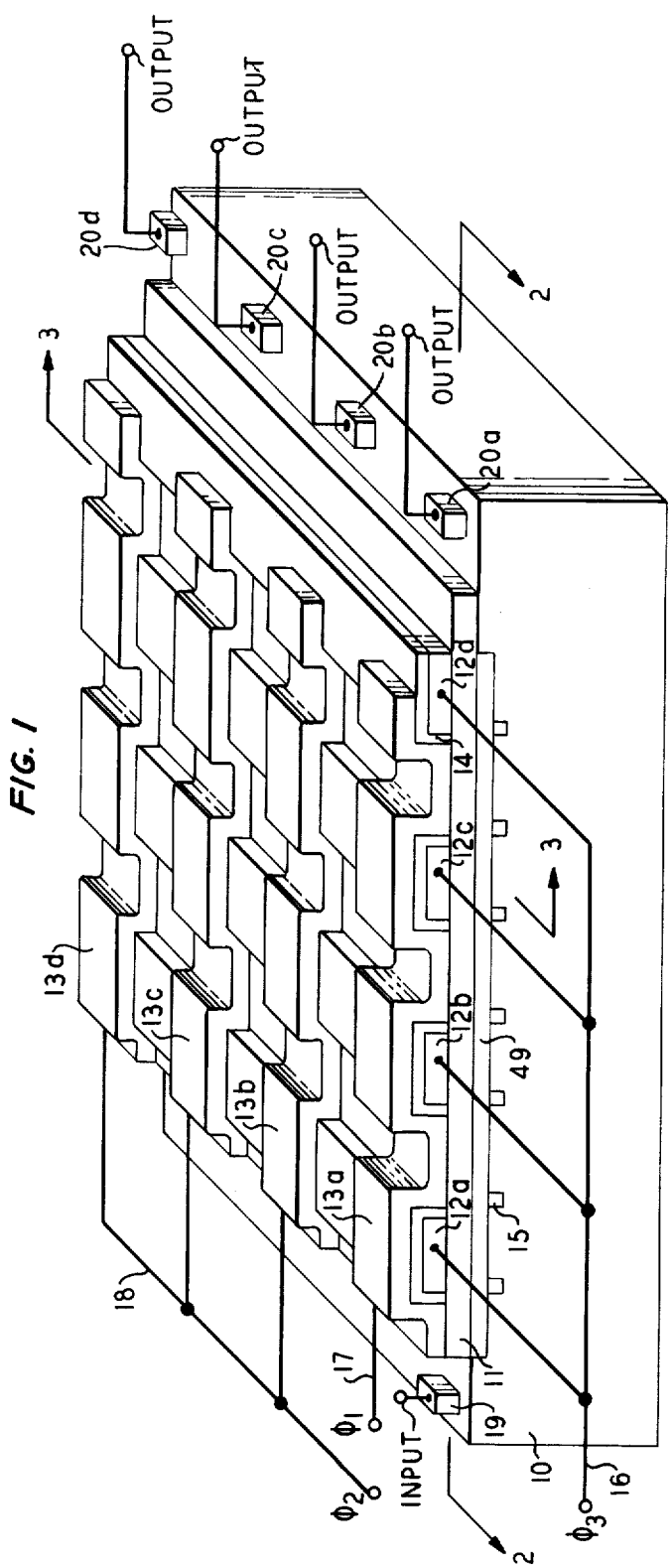

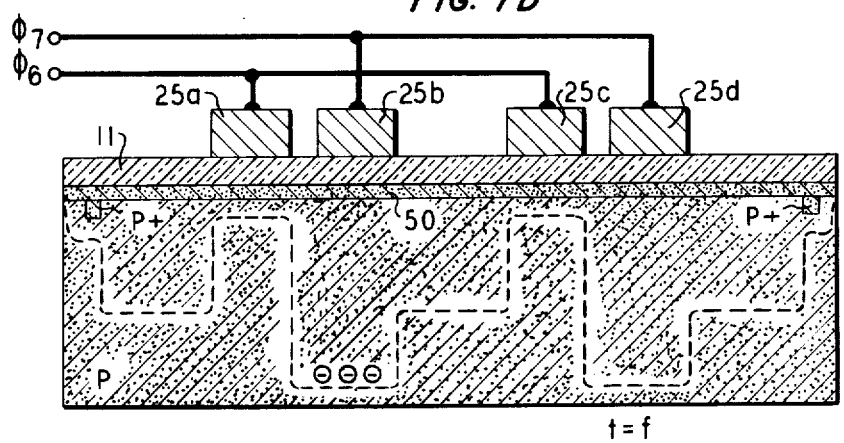
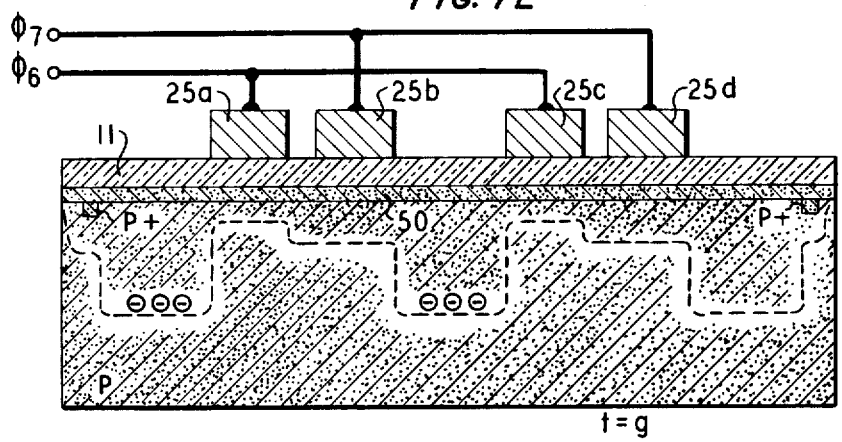
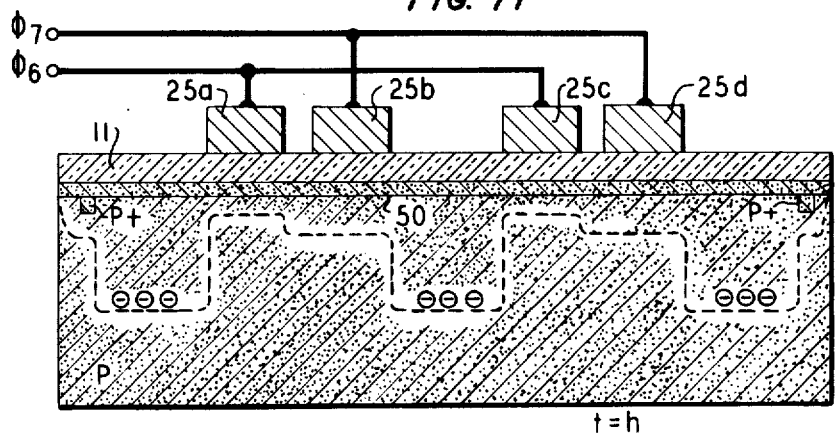

TWO-DIMENSIONAL TRANSFER IN CHARGE TRANSFER DEVICE

BACKGROUND OF THE INVENTION

This invention relates to charge transfer devices and, in particular, to such devices which include means for moving charge in two noncollinear directions in the major plane of the device.

"Charge Transfer Device" (CTD) is by now the well-known generic description for devices which store and transfer charge carriers in a storage medium by means of appropriate potentials applied to series of electrodes disposed upon an insulating layer overlying one surface of the medium. These devices may be of the charge coupled (CCD) or bucket brigade (BBD) type. In the basic bucket brigade device, regions of fixed charge are provided in the storage medium beneath each electrode and extending slightly into the area below an adjacent electrode in the charge transfer path. When an electrode is pulsed, the region of charge immediately under it is reverse-biased and the channel between this region and its neighbor is inverted to permit the transfer of charge. Thus, mobile charge carriers are stored in fixed charge regions as majority carriers and transferred through the channels as minority carriers. The basic charge coupled device stores charge carriers under depletion biased electrodes and transfers the charge carriers by creating a succession of potential wells at the storage medium surface along the transfer path. Charge is therefore stored and transferred in the form of discrete packets of minority carriers in the medium.

Various electrode configurations have been proposed for moving the charge carriers in essentially a linear path. These include schemes for moving the charge in serpentine fashion and for reversing the transfer to the opposite direction. In many information processing applications, such as time division multiplexing and circulating memories, it is necessary to provide for conversion from serial to parallel and from parallel to serial transfer of charge in the device as well as a number of other logic operations. This versatility in operation generally requires the ability to transfer charge from any particular storage location in either of two noncollinear directions. Prior art charge transfer devices have not provided this extra degree of freedom fully in the transfer process. In the frame transfer and store imaging device, for example, parallel to serial conversion is accomplished at one end of the electrode array (see, U.S. patent application of M. Tompsett, Ser. No. 285,054, filed Aug. 30, 1972). Such a device is limited to a single mode and cannot perform logic operations necessary for other applications, such as serial to parallel conversion.

It is therefore the primary object of the present invention to provide a charge transfer device which will readily permit transfer of charge in at least two noncollinear directions in order to perform the myriad logic operations required for present data needs.

SUMMARY

This and other objects are achieved in accordance with the invention in a charge transfer device which includes a network of crossed electrodes in two levels of metallization combined with appropriate doping of the storage medium to define possible charge transfer paths in two noncollinear directions at each storage site. The actual direction of transfer from any particular site in the medium is chosen by an appropriate bias supplied to the electrodes in one or the other levels of metallization. Designs may be chosen to provide for any number of phases in the addressing scheme.

BRIEF DESCRIPTION OF THE DRAWING

These and other features of the invention will be delineated in detail in the description to follow. In the drawing:

FIG. 1 is a perspective view, partly schematic, of a charge coupled device in accordance with one embodiment of the present invention;

FIGS. 7A–7F are cross-sectional views along line 7—7 of FIG. 5, illustrating movement of charge in one column of the embodiment of FIG. 5;

DETAILED DESCRIPTION OF THE INVENTION

Figure 2A:
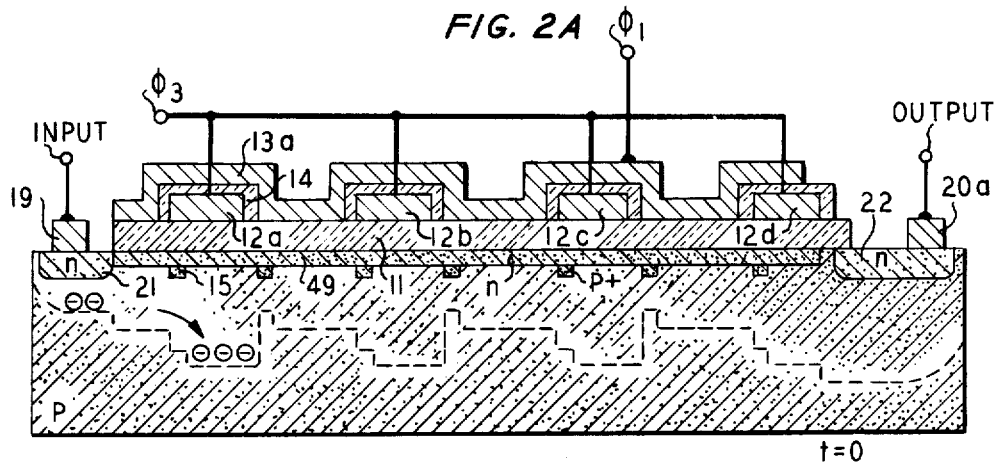
FIGS. 2A–2D are cross-sectional views along line 2—2 of FIG. 1, illustrating the movement of charge in one row of the embodiment.

FIG. 1 illustrates one basic design of a charge transfer device in accordance with the invention. The device shown in this embodiment is a charge coupled device which is capable of converting from serial input to parallel output. As will become clear in the subsequent discussion, several other design alternatives are possible. The device basically comprises a storage medium 10, such as a silicon semiconductor whose bulk is p-type, an insulating layer 11, such as $SiO_2$ overlying a substantial portion of the medium, and an array of electrodes for achieving charge transfer in the medium. In this illustrative embodiment, the storage medium has in its p-type bulk an impurity concentration of $5 \times 10^{14}$ $cm^{-3}$ and the insulator is thermally grown to a thickness of approximately 1000A. In accordance with the invention, the electrodes comprise a series of elongated metal bars 12a–12d running vertically down the active length of the device in a first level of metallization and a series of elongated metal bars 13a–13d running horizontally across the width of the device in a second level of metallization to form a network of crossed electrodes. While the vertical electrodes 12a–12d are adjacent to the insulating layer 11 over their entire length, the horizontal electrodes 13a–13d are formed over the vertical electrodes and effectively form electrodes for charge transfer only in the areas where they adjoin the insulating layer. The horizontal electrode bars are electrically isolated from the vertical electrodes by a second insulating layer 14, such as $SiO_2$, which covers the vertical electrodes. Regions of fixed charge of p+ conductivity type 15 are provided in the storage medium in the form of vertical strips running the length of the active portion of the device in a portion of the area under each vertical electrode and under the space between vertical electrodes, one end of these strips being visible in FIG. 1. Also, provided in the storage medium, although not shown in this view, are strips of fixed charge of p+ conductivity type running in a horizontal direction beneath a portion of the area under the horizontal electrodes and under the space between horizontal electrodes. The purpose of these regions is to provide a potential barrier for the reverse flow of charge as will be described in more detail below. In this embodiment, the regions are formed by ion implantation at a dose of approximately $1.2 \times 10^{12}$ ions/cm² and are formed about $3\mu$ from the back edge of the electrodes and spaces. This dosage is designed to form a potential step of approximately 5 volts. At this point, it should be emphasized that the polarity is described in terms of a p-type semiconductor storage medium. An n-type semiconductor may also be utilized with all other polarities reversed. This embodiment also includes a shallow region of n conductivity type impurities 49, essentially covering the entire surface of the medium in the area of charge transfer preferably to a depth of less than $1\mu$. Illustratively, the region is formed by an ion implantation at a dose of approximately $1.7 \times 10^{12}$ ions/cm². The function of this region will be described below. Horizontal electrode 13a is coupled to a conduction path illustrated schematically as line 17 to which a pulse train $\Phi_1$ is supplied. All other horizontal electrodes 13b, 13c and 13d are coupled to a common conduction path illustrated as line 18 to which pulse train $\Phi_2$ is supplied. All vertical electrodes 12a-12d are coupled to a single conduction path 16 to which pulse train $\Phi_3$ is supplied. An input electrode 19 is formed adjacent to the first horizontal electrode for serial read-in of charge information, and four output electrodes 20a-20d are provided adjacent to corresponding horizontal electrodes for parallel read-out of each row of charge.

The operation of the device will be described with reference to FIGS. 2A-2D, which show horizontal transfer of charge, FIGS. 3A-3E, which demonstrate vertical transfer, and FIG. 4, which illustrates a sample pulse train supplied to each conduction path. The logic circuitry needed to address the device is not shown since it is believed obvious to supply such circuitry with an understanding of the operation of the device.

FIGS. 2A-2D are cross-sectional views along line 2—2 of FIG. 1. As shown in FIG. 2A, the input means comprises an electrode 19, previously described, in association with a localized n-type region 21 which forms a p-n junction for the introduction of minority carriers (electrons) into the storage medium upon the application of a suitable potential. Minority carriers are detected at the other end of the row by a combination of localized n-type region 22 and electrode 20a, previously mentioned, which is reversed biased by suitable means (not shown), such that output minority carriers are collected at the p-n junction and appear as a current at the output terminal. Various input and output means are known in the art and any suitable form may be used. The dashed line in these figures is a schematic illustration of the depletion region depth, which in turn is representative of the potential, V, created at the storage medium-insulator interface by the biased electrodes. In the following discussion, it will be understood that specific values for surface potential given beneath the electrodes are exclusive of the areas beneath the p+ regions.

Figure 2B:
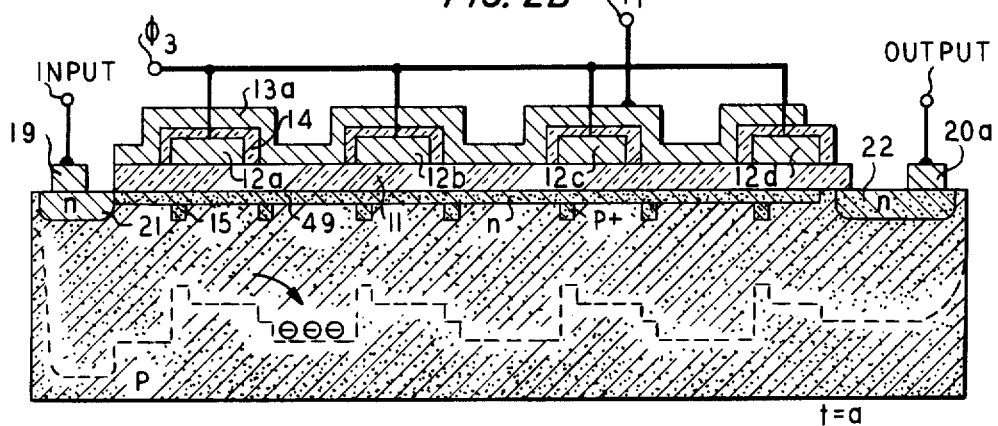
Figure 2C:
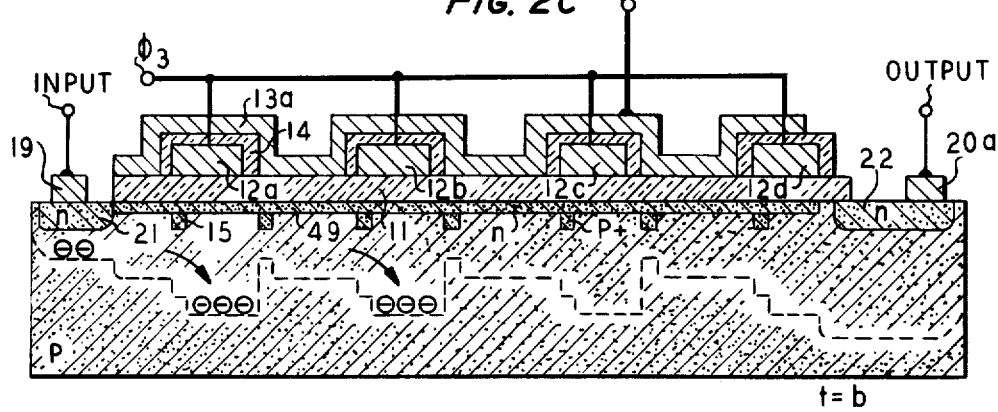
Figure 3A:
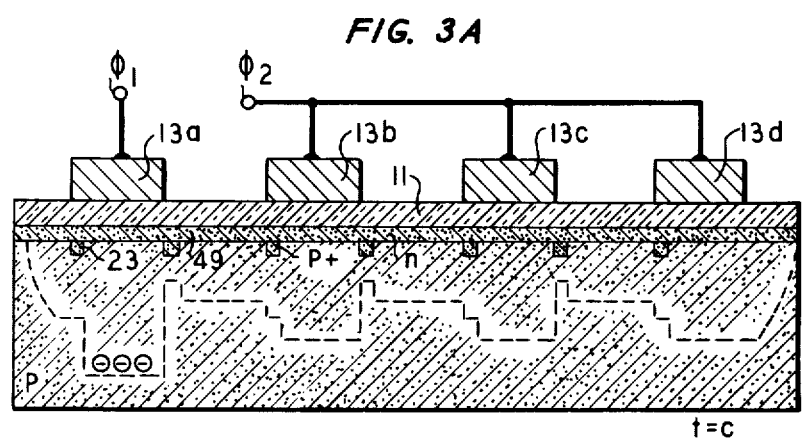
FIGS. 3A–3E are cross-sectional views along line 3—3 of FIG. 1, illustrating movement of charge in one column of the embodiment.
Figure 4:
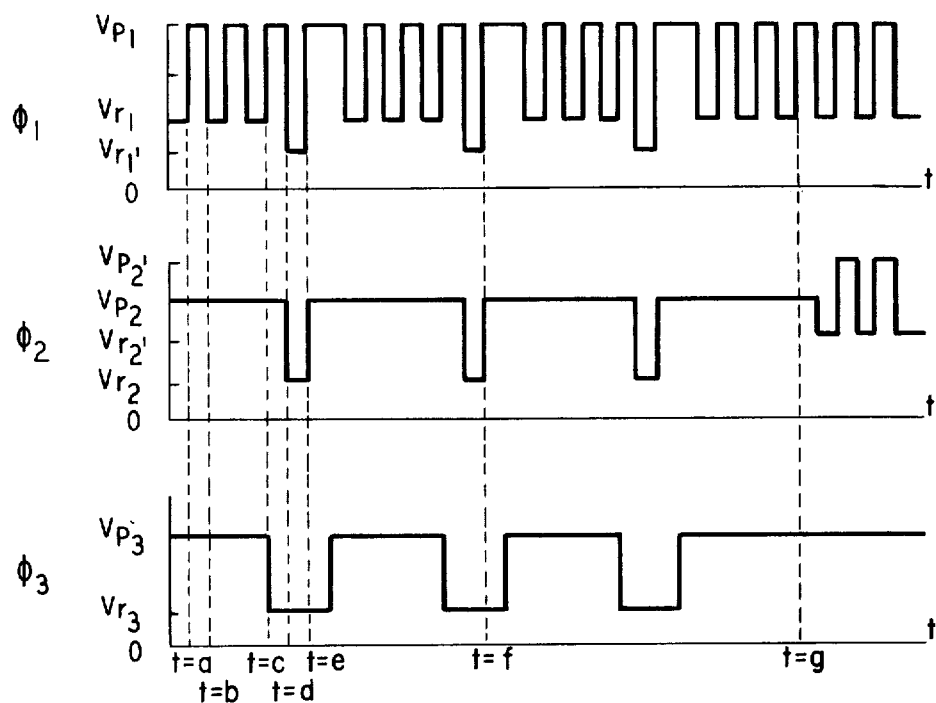
FIG. 4 is a schematic diagram of the pulse train supplied to each conduction path of a device in accordance with the same embodiment.

Referring to FIG. 4 in association with FIG. 2A, it will be seen that at time $t=o$, a positive bias is supplied to electrode 13a by means of pulse train $\Phi_1$, which establishes a surface potential $V_{r_1}$ in the area under 13a between vertical electrodes. A surface potential $V_{p_3}$ is established beneath vertical electrodes 12a – 12d by pulse train $\Phi_3$. Since $V_{p_3}$ is greater than $V_{r_1}$, the depletion region depth under the vertical electrodes is greater than that under the spaces between vertical electrodes. Thus, minority carriers represented by "$\theta$" which are introduced into the medium by the input means are attracted to the area under electrode 12a. No further transfer occurs due to the potential barrier created in the adjacent space by electrode 13a. The collected charge packet is then transferred into the area under the space adjacent to electrode 12a at $t=a$ by increasing the surface potential in the space to $V_{p_1}$ while keeping a constant bias supplied to electrodes 12a – 12d. Since the depletion depth is now greater in the spaces between vertical electrodes, the minority carriers will be attracted thereto as shown in FIG. 2B. Transfer continues down the row at $t=b$ as shown in FIG. 2C, by again setting the potential beneath electrode 13a at $V_{r_1}$ so that the charge packet is attracted to beneath adjacent vertical electrode 12b. At the same time, a new packet of charge is introduced into the medium and attracted to beneath electrode 12a. It can be seen that the purpose of the strips p+ regions such as 15 is to create a potential barrier so that charge will move only to the right during the pulsing sequence. The doping of these regions in accordance with this function can therefore vary widely depending upon the storage medium impurity concentration, the thickness of insulator and the magnitude of potential applied to the electrodes. The doping required for any particular device can be easily calculated by anyone skilled in the art. (For a detailed discussion of the use of such impurity regions in a linear device, see U.S. patent application of G. F. Amelio-R. H. Krambeck-K. A. Pickar, Ser. No. 157,507, filed June 28, 1971 and assigned to the same assignee). This pulsing sequence is continued until charge packets reside under each of the spaces between vertical electrodes 12a – 12d to the extent that the input signal requires so that they may now be transferred in the vertical direction. During the period of horizontal transfer, it will be noted that the pulse train $\Phi_2$ applies a constant potential to the horizontal electrodes 13b, 13c and 13d to form a surface potential $V_{p_2}$ thereunder. This potential is chosen so that it is less than that formed in the spaces between vertical electrodes under pulsed electrode 13a and less than or equal to that formed under the vertical electrodes during horizontal transfer. This choice of potential creates barriers to any vertical transfer of charge. Vertical transfer is also prevented by fixing the surface potential formed in the medium under the spaces between horizontal electrodes at a value which is less than or equal to the value of the surface potential created by electrode 13a at its pulsed off condition ($V_{r_1}$) during the horizontal transfer cycle. (The former value can be seen in reference to the vertical cross section of FIG. 3A).

Figure 2D:
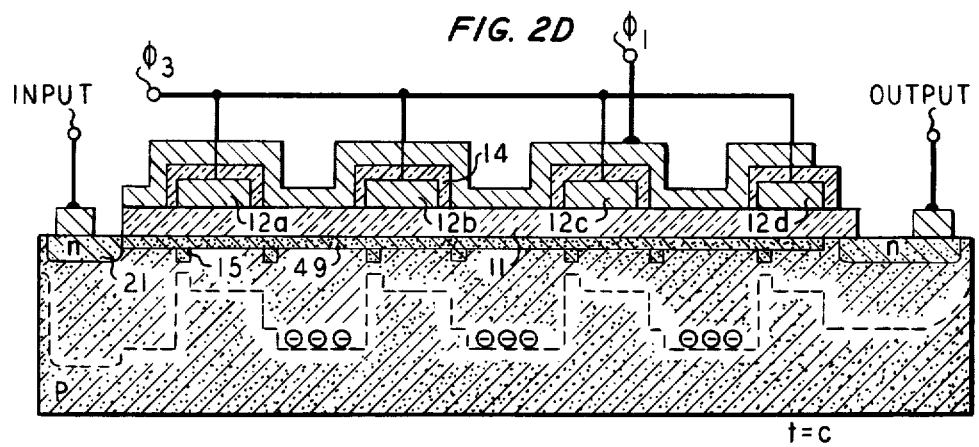

At $t=c$, the charge packets have been transferred to the appropriate storage sites for vertical transfer as shown in FIG. 2D. The potential beneath electrodes 12a - 12d formed by pulse train $\Phi_3$ is lowered to $V_{r_3}$ which is always less than or equal to that formed in the vertical channel either under horizontal electrodes 13a - 13d or in the spaces between these electrodes during vertical transfer. This establishes a potential barrier to transfer of charge in the horizontal direction. The input electrode is also set so that no new information is introduced during the vertical transfer cycle.

Vertical transfer is now described with continued preference to FIG. 4 and the vertical cross-sections of FIGS. 3A–3E taken along line 3—3 of FIG. 1. It will be noted first in FIG. 3A that the device further includes strips of fixed charge regions of p+ conductivity type such as 23, running horizontally under a portion of each horizontal electrode and under a portion of the spaces between these electrodes as shown. The design of these regions of charge is identical to that of the vertical strips, 15, and serve a similar function in creating potential barriers to reverse flow of charge in the vertical direction.

FIG. 3A shows the vertical channel at the same point in time as that shown in FIG. 2D ($t=c$). It will be seen that a charge packet resides under electrode 13a and is prevented from moving down the path by the potential barrier in the area under the space between electrodes. The potential in these spaces is fixed by the uniform implant of n-type impurities, 49, at the semiconductor surface. In this example, the implant was carried out with a dose of $1.7 \times 10^{12}$ ions/cm$^2$ to produce the proper surface potential for this operation which in this example is approximately 10 volts. The precise impurity concentration necessary for a particular device and a particular operation may be calculated according to well-known techniques and a detailed discussion of this point is omitted here. Furthermore, the space potential may be fixed by a uniform doping of the insulator or by a localized doping in the spaces of the storage medium. (For a detailed discussion of fixing potential in interelectrode spaces for charge transfer, see application of Amelio-Krambeck-Pickar, supra).

Figure 3B:
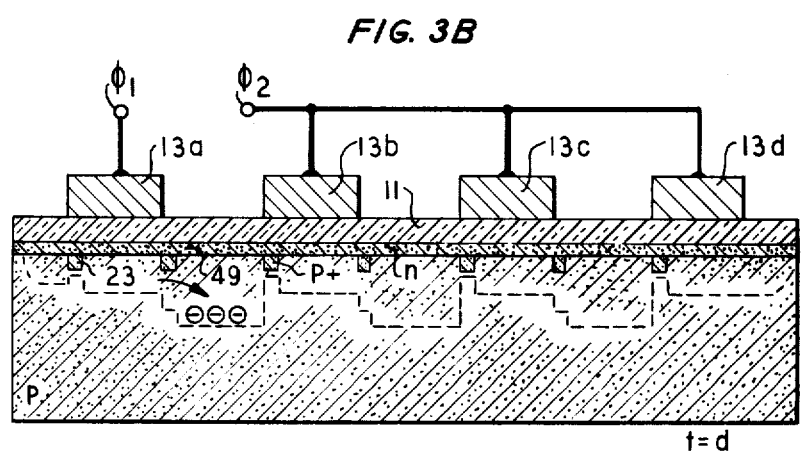
Figure 3C:
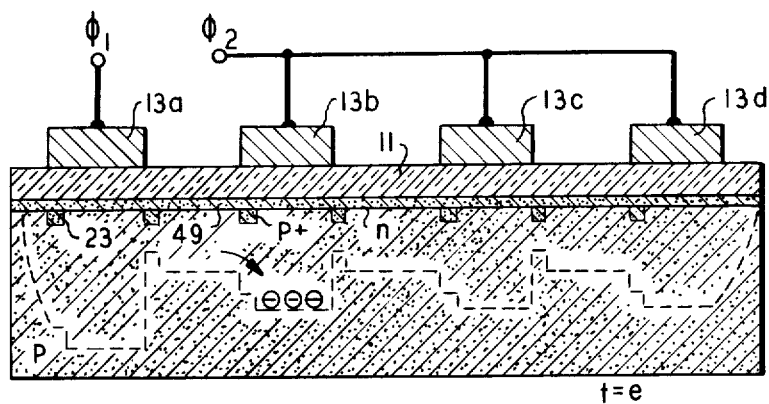
Figure 3D:
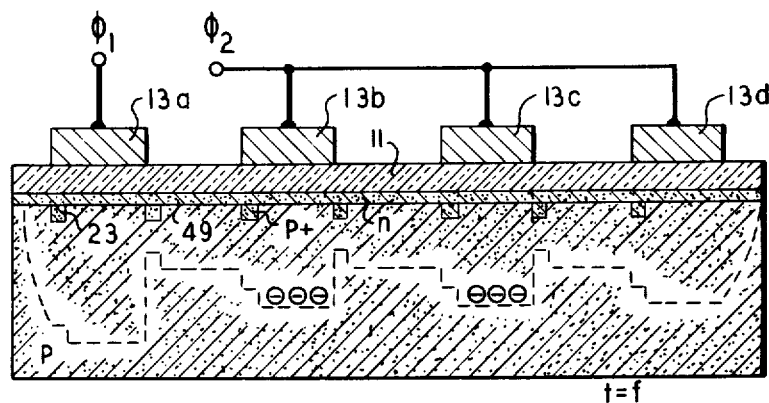
Figure 3E:
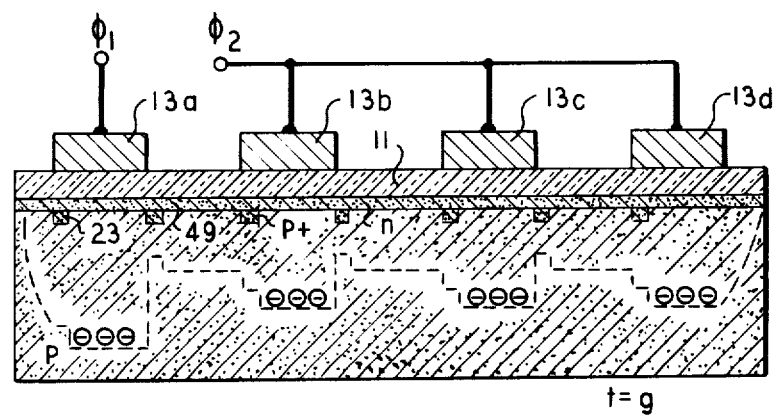

Vertical transfer begins at $t=d$, as shown in FIG. 3B with a lowering of the bias applied to electrodes 13a and 13b–13d to create surface potentials thereunder of $V_{r_1}'$ $V_{r_2}$ respectively (illustratively, $V_{r_1}' = V_{r_2}$). This creates a lower surface potential under the electrodes than in the spaces and the charge packets are therefore transferred to the space between electrodes as shown. At $t=e$, the packets are transferred to the area under electrode 13b by returning the surface potential under electrode 13a to $V_{p_1}$ and the potential under 13b, 13c and 13d to $V_{p_2}$. This stage is shown in FIG. 3C. At this point in the operation of the serial-to-parallel device, a second row of charge carrier packets may be introduced into the area under horizontal electrode 13a by repeating the pulsing sequence shown from $t=o-c$ for all electrodes, while the first row of packets is stored in the area under horizontal electrode 13b. Once this row of packets is in position, vertical transfer is continued by repeating the pulsing sequence shown for $t=d-e$. This moves the first row of packets to the area under electrode 13c and the second row to the area under electrode 13b at $t=f$ as shown in FIG. 3D. This same procedure of reading in horizontally and transferring vertically is repeated until ultimately, at $t=g$ as shown in FIG. 3E, charge packets reside under each of the horizontal electrodes 13a–13d.

Each row of charge may now be transferred to its associated output means (electrodes 20a–20d of FIG. 1). In order to accomplish this, $\Phi_1$ and $\Phi_3$ supply the same amplitude and frequency pulse train as described for reading in charge. The input electrode is set at a potential which will not introduce charge, and the potential established by the output electrode is such that when a packet reaches the area under the last vertical electrode in the row (electrode 12d) it will be collected by the n-type region and read out as a current. The only major distinction in this parallel readout is that the potentials applied to horizontal electrodes 13b, 13c and 13d by pulse train $\Phi_2$ are now identical in magnitude to these applied to 13a by $\Phi_1$ during horizontal transfer (see FIG. 4). These potentials are reset since otherwise the depletion region under electrodes 13b, 13c and 13d would vary above and below the depth in the spaces between horizontal electrodes as in FIGS. 3A–3E resulting in an undesired vertical transfer. Thus, the bias applied to the horizontal electrodes during this readout is such that the surface potential thereunder is always greater than the surface potential in the spaces between horizontal electrodes and vary above and below the potential under the vertical electrodes for horizontal transfer as in FIGS. 2A–2D.

In order to operate the device as described above, the surface potentials chosen may be any value as long as they are related to one another as previously described. The following is one illustrative example:

$V_{p_1} = 20$ volts
$V_{r_1} = 10$ volts
$V_{r_1}' = 5$ volts
$V_{p_3} = 15$ volts
$V_{r_3} = 5$ volts
$V_{r_3}' = 20$ volts
$V_{p_2} = 15$ volts
$V_{r_2}' = 10$ volts
$V_{r_2} = 5$ volts The impurity concentration of the p+ regions in this embodiment causes a differential in surface potential of 5 volts thereunder. The magnitude of the bias which must be supplied to the respective electrodes to establish these surface potentials will of course vary depending upon the thickness of the insulator, the impurity concentration of the shallow n-type region and the impurity concentration of the storage medium. The calculation of such values is known in the art and consequently not discussed.

It should be emphasized at this point that the square wave pulse train shown in FIG. 4 is used primarily for purposes of illustration. In actual practice, it would be more desirable to provide a sawtooth-type pulse for greater transfer efficiency. It will also be appreciated that the devices described in this application are capable of many more modes of operation. Horizontal-to-vertical and vertical-to-horizontal conversion may be accomplished at any point in the defined transfer paths by changing the driving pulses as indicated. Thus, single bits of information may be introduced and transferred to any desired storage sites in an x-y memory device. As another example, mass parallel-to-serial and serial-to-parallel conversion may be effected by providing input means adjacent to each row and output means at the ends of each column in the array. The serial-to-parallel conversion operation described should, therefore, not be considered as a limiting factor in the operation of devices in accordance with the invention.

Figure 5:
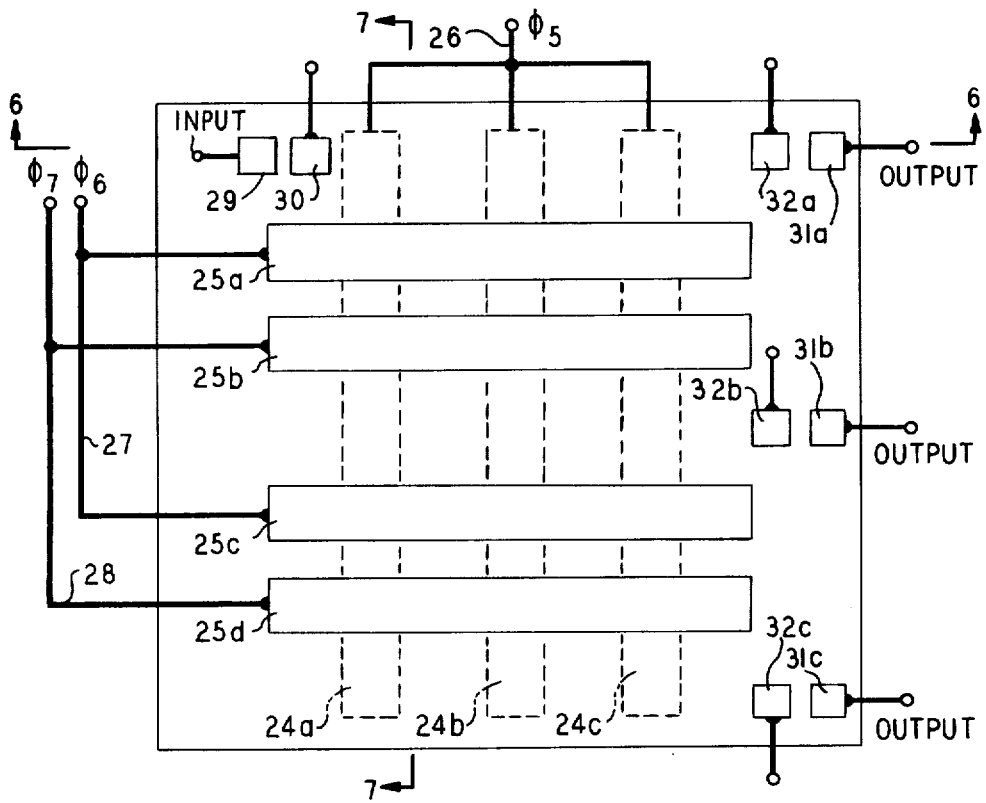
FIG. 5 is a schematic plan view of a charge coupled device in accordance with a second embodiment of the present invention.

FIG. 5 illustrates an alternative embodiment in accordance with the invention in a schematic plan view of a charge coupled device capable of serial-to-parallel conversion. The device again comprises a charge storage medium, a first insulating layer overlying the medium and a crossed electrode structure in two levels of metallization electrically separated by a second insulator. Here the first level comprises three elongated metal bars 24a, 24b, 24c which form the vertical electrodes. These electrodes are shown in phantom in the view of FIG. 5 where covered by the second insulator. The vertical electrodes are addressed by applying a pulse train $\Phi_5$ to the electrodes by means of a common conduction path illustrated schematically as line 26. The second level of metallization comprises elongated metal bars 25a, 25b, 25c and 25d, placed horizontally across the device in sets of two electrodes separated by a wide space. The first electrode in each set is driven by pulse train $\Phi_6$ applied by common conduction path 27 and the second electrode in each set is driven by pulse train $\Phi_7$ applied by conduction path 28. This and other embodiments described herein can of course comprise many more electrodes and simple arrangements are presented for illustrative purposes. The device again includes one input electrode, 29, placed adjacent to the horizontal transfer path, and output electrodes 31a, 31b and 31c placed at the other end of each horizontal path to permit serial-to-parallel conversion. The input and output means differ in this embodiment in the addition of gate electrodes 30, 32a, 32b and 32c associated with the input and output electrodes in order to provide the proper potential for introducing and detecting charge in the storage medium as described below. Once again these input and output means in themselves are well known in the art. The operation of the device is demonstrated with reference to FIG. 8, which is a schematic illustration of sample pulse trains supplied to each conduction path, FIGS. 6A-6D which are cross sectional views along line 6—6 of FIG. 5, and FIGS. 7A-7F which are cross sectional views along line 7—7 of FIG. 5.

It will first be noticed in FIG. 6A that there are again provided vertical strips of fixed charge regions, 33, of p+ conductivity type under a portion of each vertical electrode and under a portion of the spaces therebetween. These regions extend the full length of the device and perform the same function as in the previous embodiment. A shallow implant of n-type conductivity impurities, 50, is also included at the storage medium-insulator interface as before to set the surface potential in the spaces between electrodes. The doping density of regions 33 and 50 may be the same as that described for regions 15 and 49 respectively in the previous embodiment.

The first packet of charge is introduced into the first row at $t=o$ by reverse biasing the localized n region of the input means and applying a potential, $V_{Gate}$ to the gate electrode 30 to create a depletion region depth between that caused by the input electrode and that formed under the first vertical electrode 24a. The vertical electrodes have a positive potential applied thereto in order to create a surface potential $V_{p5}$ thereunder which is greater than in the areas under the spaces between electrodes as shown. Again, the surface potential under the spaces may be fixed at the desired level by a localized doping of the semiconductor in the spaces or a uniform doping of the insulator, as well as the uniform doping of the semiconductor as shown here.

Figure 6A:
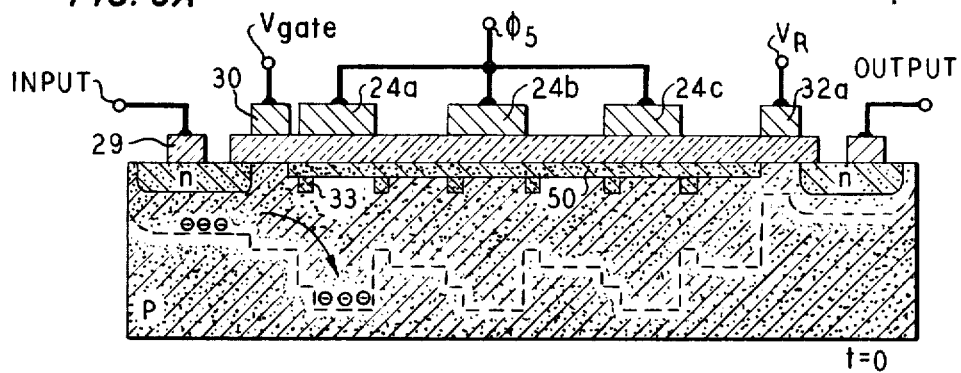
FIGS. 6A–6D are cross-sectional views along line 6—6 of FIG. 5, illustrating movement of charge in one row of the embodiment of FIG. 5.
Figure 6B:
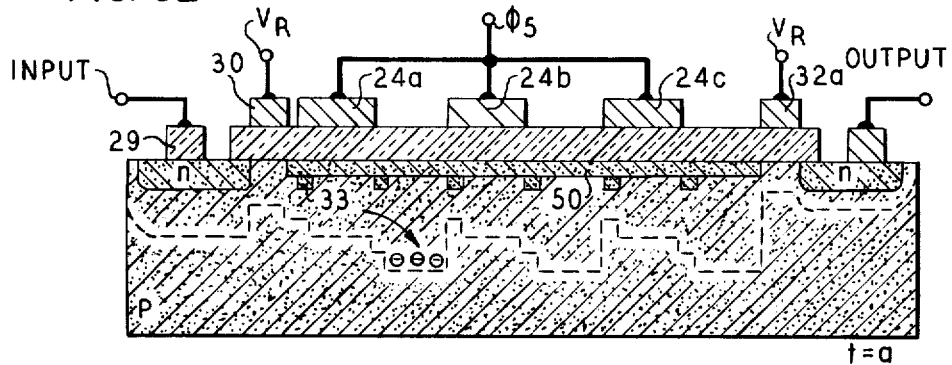
Figure 6C:
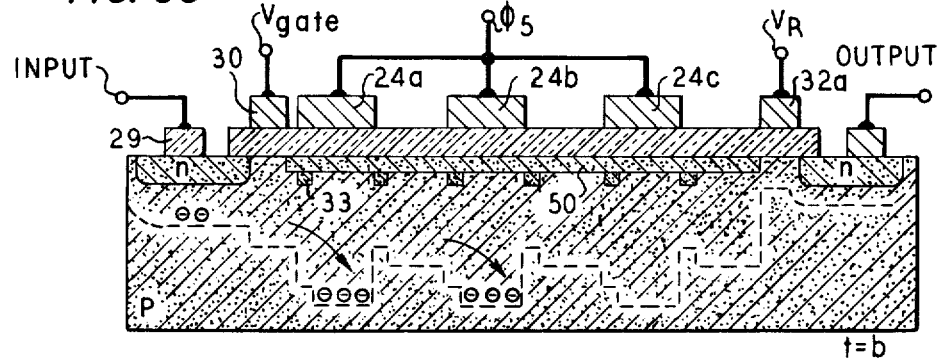
Figure 6D:
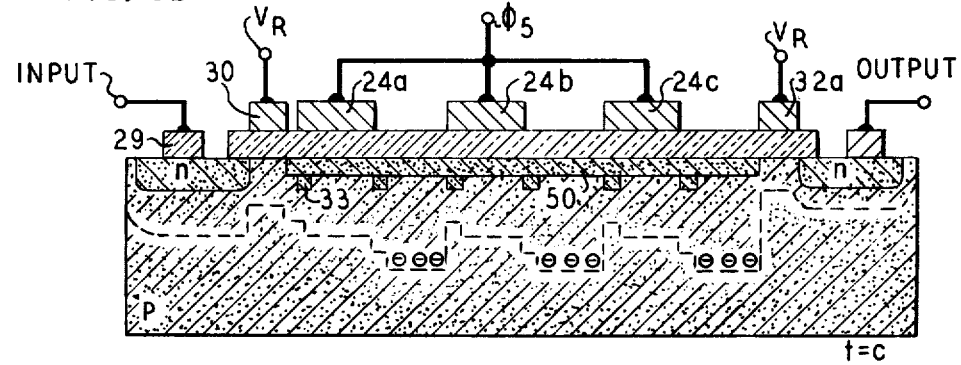

In order to transfer to the right, at $t=a$ the bias applied to the vertical electrodes is lowered so that the surface potential $V_{r5}$ under the electrodes is less than that under the spaces. This is illustrated in FIG. 6B. Additional charge information is prevented from entering the row by applying a potential to electrode 30, $V_R$, which sets up a blocking potential between the localized n region and the area under the first vertical electrode. The next packet of charge is then introduced at $t=b$ by returning electrode 30 to $V_{Gate}$ and returning the surface potential under vertical electrodes 24a-24c to $V_{p5}$. This also causes the transfer of the first packet to the area under electrode 24b as shown in FIG. 6C. This process is repeated until a charge packet resides under each of the spaces between vertical electrodes to the extent that the input signal requires at $t=c$ as shown in FIG. 6D. At this point, the device switches to vertical transfer. During this vertical cycle, electrodes 24a-24c are simply kept at $V_{r5}$ in order to form blocking potentials to any horizontal transfer. FIGS. 7A-7F illustrate transfer down the vertical transfer path between vertical electrodes 24a and 24b. It will be noted in this embodiment that there are no horizontal strips of charge needed to prevent backward flow. The required asymmetry in the interface potential is produced by the pulsing sequence itself. However, there are horizontal strips of fixed charge (not shown) localized beneath the edges of the horizontal electrodes where the electrodes cross the vertical electrodes. These regions prevent charge from transferring down the area beneath the vertical electrode during horizontal transfer. Two horizontal strips of charge are also provided on either edge of the charge transfer portion of the device as shown in FIGS. 7A-7F.

Figure 7A:
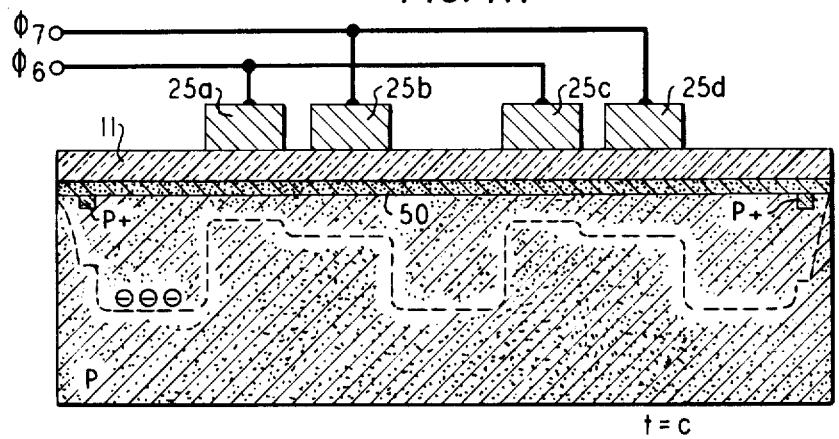
Figure 7B:
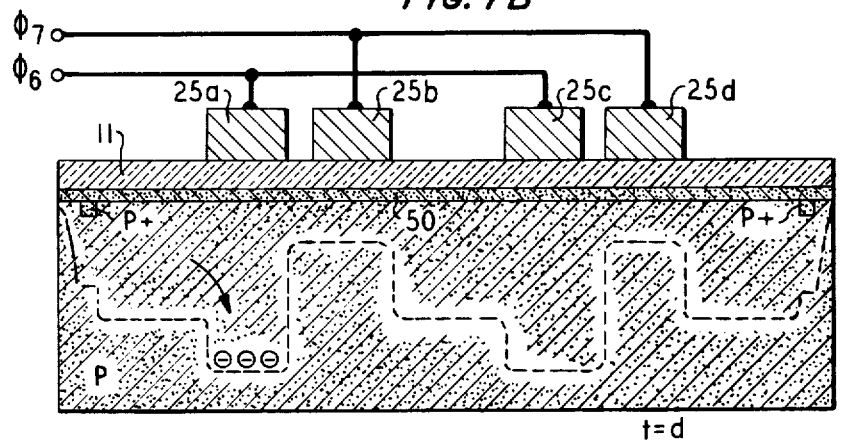
Figure 7C:
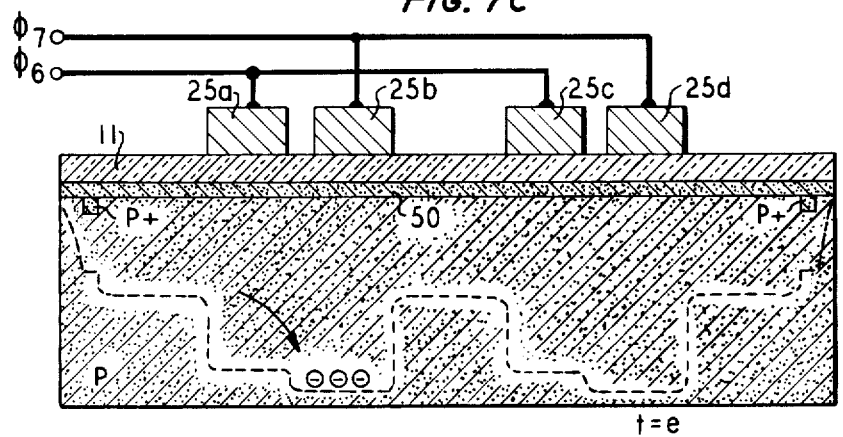
Figure 8:
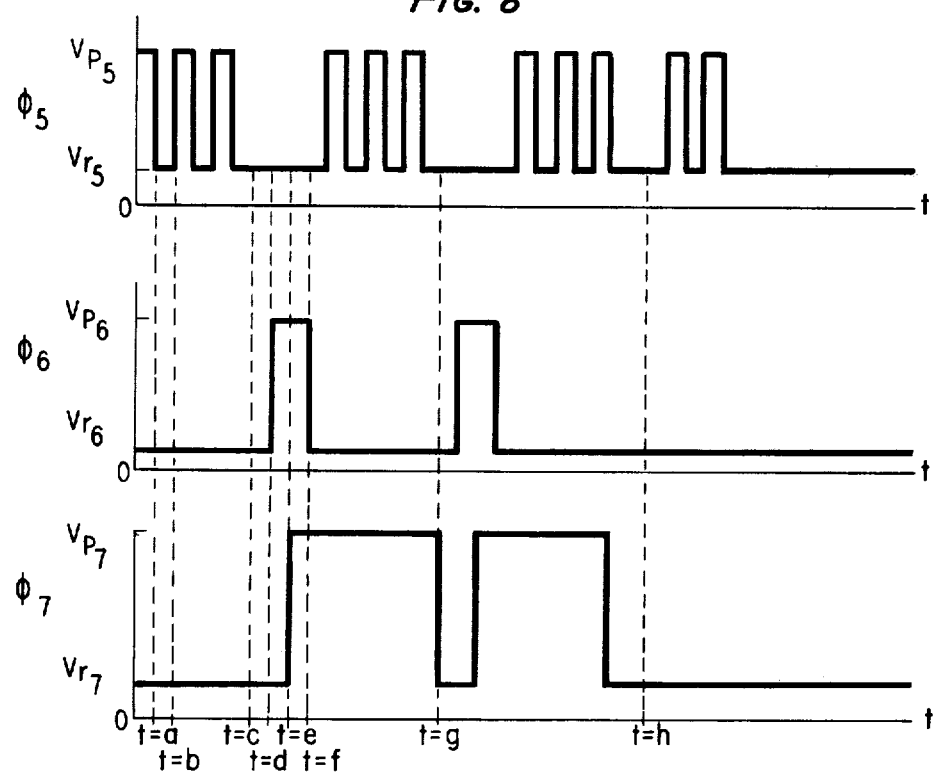
FIG. 8 is a schematic diagram of a sample pulse train supplied to each conduction path of the embodiment of FIG. 5.

FIG. 7A shows the position of charge at $t=c$ just after horizontal transfer is completed. The bias applied to the horizontal electrodes by $\Phi_6$ and $\Phi_7$ during the horizontal transfer cycle were of a magnitude such as to create surface potentials ($V_{r6}$ and $V_{r7}$, respectively) under the horizontal electrodes which ere always less than or equal to surface potentials under the vertical electrodes or in the spaces between vertical electrodes in order to block vertical transfer. This potential profile is illustrated in FIG. 7A. In this embodiment, $V_{r6}$ is less than $V_{r7}$. At $=d$, vertical transfer begins by increasing the applied potential to electrodes 25a and 25c to a sufficient magnitude to create a surface potential $V_{p6}$ thereunder which is greater than that established in the spaces between the sets of horizontal electrodes. This causes a transfer of the row of charge packets to underneath electrode 25a as shown in FIG. 7B. Next, at $t=e$, a bias is applied to electrodes 25b and 25d to create a surface potential $V_{p7}$ thereunder which is greater than that under electrodes 25a and 25c ($V_{p7} > V_{p6}$) to transfer the charge packets to the area under electrode 25b. This is shown in FIG. 7C. As shown in FIG. 7D, the surface potential under electrodes 25a and 25c are then returned to $V_{r6}$ and the packets are stored under electrode 25b. It will be appreciated that the overlap in the pulses supplied by $\Phi_6$ and $\Phi_7$ prevents the backward flow of charge in the vertical direction. However, if desired, the direction of transfer could be reversed by supplying the pulse train $\Phi_7$ to 25a and 25c and $\Phi_6$ to 25b and 25d.

The next row of packets may then be read in by repeating the pulsing sequence of the vertical electrodes for horizontal transfer as previously described. The packets stored under electrode 25b are secure during this horizontal transfer since the surface potential formed by the vertical electrodes is always less than that formed under 25b. The surface potential under electrode 25a is sufficiently low so as to form a potential barrier to vertical transfer of charge from the first row. After the packets have reached their positions beneath the spaced between vertical electrodes, the charge packets under 25b are transferred to the adjacent area beneath the space between sets of horizontal electrodes. This is accomplished by returning the surface potential beneath electrode 25b to $V_{r_7}$ at $t=g$ as shown in FIG. 7E.

The process of vertical transfer, as shown in FIGS. 7A–7D is repeated so that the two rows of charge packets are stored under electrodes 25b and 25d. The third row is read in as were the first two and the first and second row of packets are then transferred so that each resides beneath a space between horizontal electrodes as shown in FIG. 7F at $t=h$.

Parallel readout is then achieved by first applying a potential, $V_{Gate}$, to the gate electrodes of the output means (32a, 32b, 32c in FIG. 5) so that the depletion region under these gates is greater than that under the adjacent space. Charge carriers in these spaces will therefore be transferred to the localized $n$ region at the output and appear as a current. Readout of each row simultaneously is effected by simply pulsing the vertical electrodes 24a, 24b, 24c at the same amplitude and frequency as in the horizontal transfer of FIGS. 6A–6D. The low potential applied to the horizontal electrodes 25a, 25b, 25c, 25d blocks any vertical transfer during this period.

Once again it will be appreciated that although a serial-to-parallel conversion is illustrated, this alternative embodiment is capable of a wide variety of logic operations.

Figure 9:
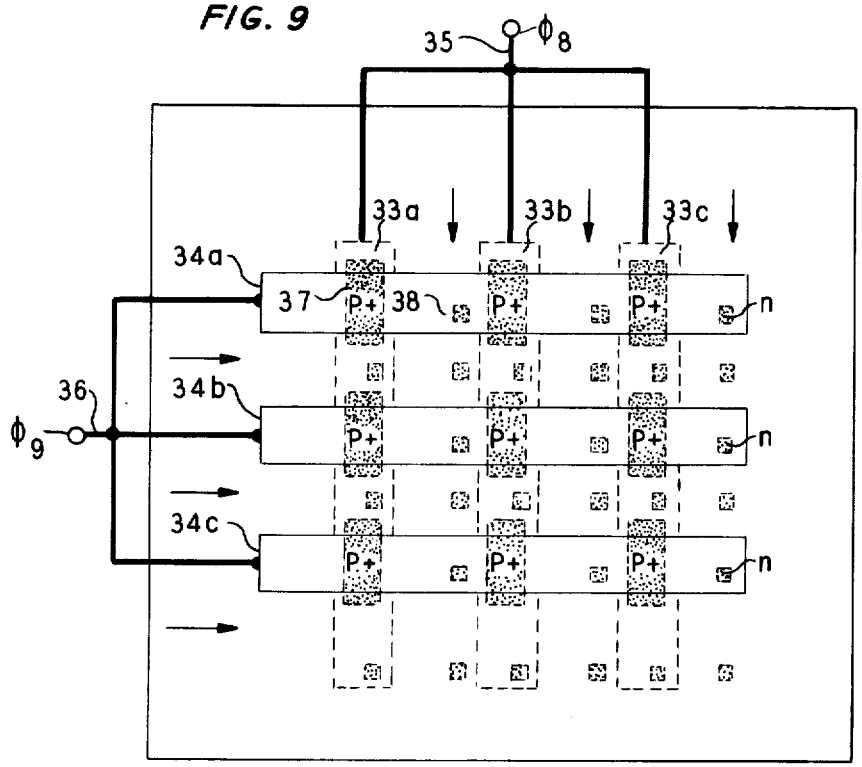
FIG. 9 is a schematic plan view of a third embodiment in accordance with the invention.
Figure 10:
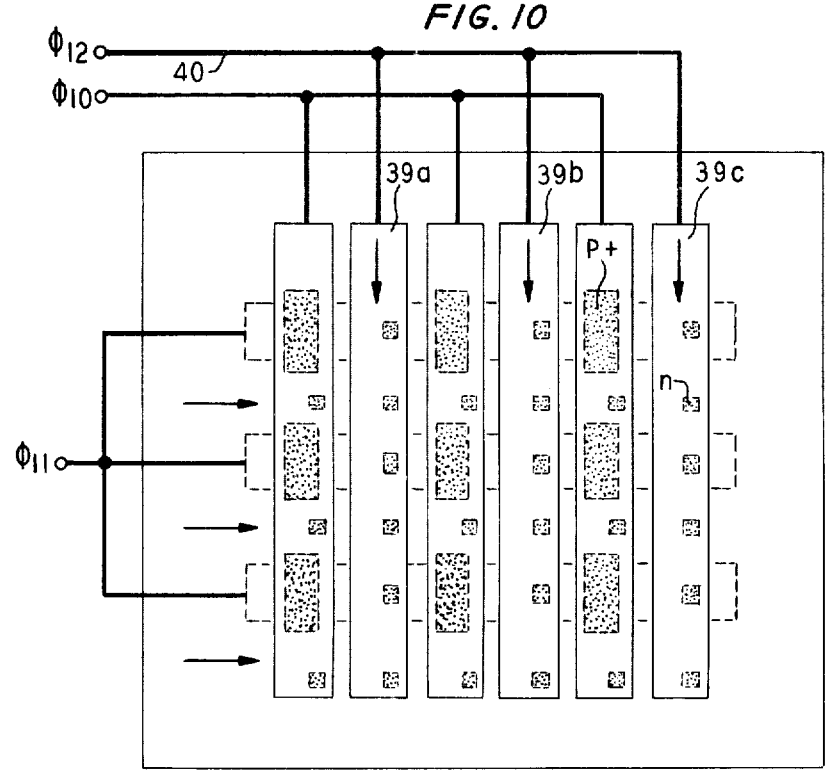
FIG. 10 is a schematic plan view of a fourth embodiment in accordance with the invention.
Figure 11:
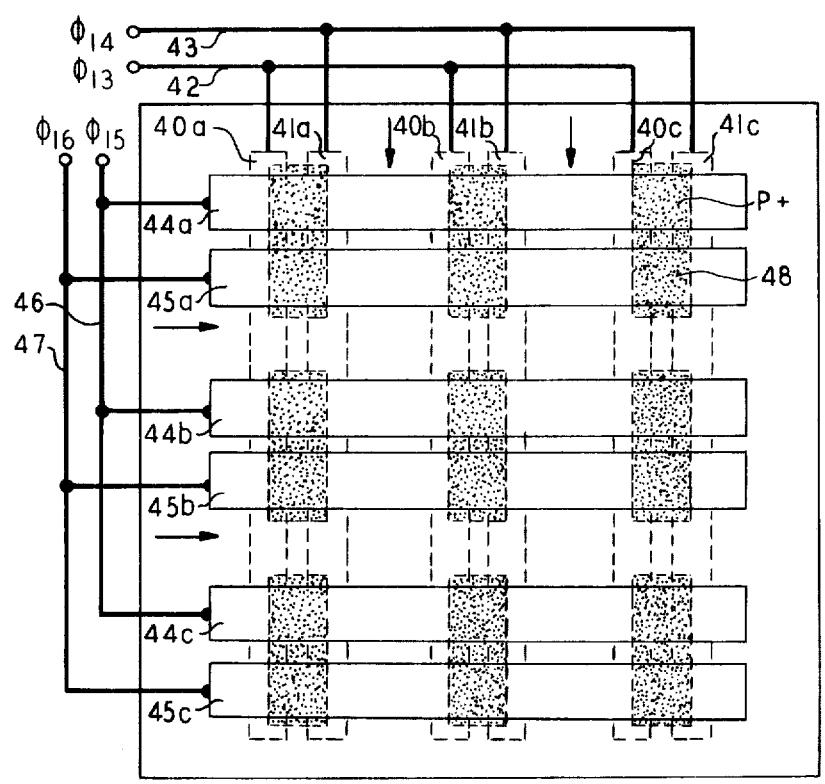
FIG. 11 is a schematic plan view of a fifth embodiment in accordance with the invention.

Again, the charge concentrations of the p+ regions, the $n$ region and the semiconductor may be the same as that described in the previous embodiment. An illustrative set of surface potentials for the serial-to-parallel operation of the second embodiment is as follows:

$V_{p_5}$32 15 volts
$V_{r_5}=$ 5 volts
$V_{p_6}=$ 15 volts
$V_{r_6}=$ 1 volt
$V_{p_7}=$ 20 volts
$V_{r_7}=$ 5 volts Several other alternative embodiments in accordance with the invention may be useful. Some of these are shown in FIGS. 9–11. In view of the above discussion, it is believed that the operation of these embodiments will become obvious to those skilled in the art. Therefore, a detailed discussion is omitted. It will be understood in subsequent embodiments that the devices include the basic elements of the previous embodiments, i.e., storage medium, insulator, electrodes in two levels of metallization and a second insulator separating the two levels. The figures are designed to show the particular electrode pattern and the appropriate localized doping of the storage medium to define the charge transfer paths. Therefore the electrodes and doping are shown in one plan view. In particular, the first level of electrodes is shown in phantom where covered by the second insulator and the doped regions are shaded. It will be understood that in any structure wherein one of the storage sites is not covered by an electrode, a surface implant is required to fix surface potential as described previously. These regions are omitted in subsequent drawings for the sake of clarity. Input and output means are omitted. Again, simple devices are shown for purposes of illustration.

FIG. 9 illustrates a device which operates with a one-phase driving scheme in both horizontal and vertical directions. The device comprises three vertical electrodes, 33a, 33b, 33c in the first level of metallization and horizontal electrodes 34a, 34b and 34c in the second level. The vertical electrodes are coupled to a single conduction path 35 to which pulse train $\Phi_8$ is applied, while horizontal electrodes are coupled to a single conduction path 36 to which $\Phi_9$ is applied. One distinctive feature of this embodiment is the placing of regions of fixed charge of p+ conductivity type 37 (again assuming a p-type semiconductor storage medium) in the area of the medium below the crosspoints of the two levels of electrodes. This creates a potential barrier in these regions to prevent any minority carriers from transferring through these regions. The embodiment also differs in that the asymmetry of the potential profiles in the horizontal and vertical transfer paths which is necessary to prevent reverse flow is supplied by regions of fixed charge of $n$ conductivity type, 38. These regions create an attractive potential in the direction of transfer rather than a barrier in the opposite direction as shown in previous embodiments. (For a discussion of this method of forming aymmetry, see application of Amelio-Krambeck-Pickar, supra). The transfer paths thus defined by the electrodes and fixed charge regions in the horizontal and vertical directions is indicated by the arrows. Pulsing the vertical electrodes transfers charge horizontally to the right and pulsing the horizontal electrodes transfers charge downward in the figure. While one set of electrodes is being pulsed, the other set can be held at a rest potential. As before, the potentials are chosen so that during transfer in a desired direction the surface potential under the electrodes varies above and below that fixed in the spaces between electrodes by the interface charge (not shown) while in the other direction the electrodes create suitable blocking potentials.

As illustrated in FIG. 10, this basic design may be modified so as to form a two-phase drive in both horizontal and vertical directions. This is accomplished by adding the set of vertical electrodes 39a, 39b, 39c which are coupled to path 40 to which pulse train $\Phi_{12}$ is applied. (It will be noted that in this device, the vertical electrodes are on the second level of metallization.) This set of electrodes may be pulsed in antiphase with the other vertical electrodes for horizontal transfer and in antiphase with the horizontal electrodes for vertical transfer. Alternatively the electrodes 39a, 39b, 39c can be set at a dc potential. Again, transfer paths are indicated by the arrows.

In FIG. 11, the embodiment shown provides extra degrees of freedom since charge can be transferred forward and backward in both the horizontal and vertical directions. The vertical electrodes 40a–40c and 41a–41c are arranged in sets of two electrodes separated by wide spaces as shown. The first electrode in each set is coupled to path 42 to which pulse train $\Phi_{13}$ is supplied and the second electrode in each set is coupled to path 43 to which $\Phi_{14}$ is applied. Horizontal electrodes 44a–44c and 45a–45c are similarly arranged, with path 46 coupled to the first electrode in each set and path 47 coupled to the second electrode in each set. Again regions of fixed charge of p+ conductivity type, 48, are supplied in the area under the crossing points of the electrodes in order to prevent charge flow in these areas. The transfer paths are shown by the arrows.

Horizontal transfer to the right is effected by first pulsing electrodes 40a–40c on and then pulsing on electrodes 41a–41c so that the pulses overlap. Reversing the sequence reverses the direction of transfer. (The pulsing sequence is illustrated in FIGS. 7A–7F with reference to the embodiment of FIG. 5.) The same pulsing sequence applied to the horizontal electrodes transfers in the vertical direction either up or down.

It will also be appreciated that any of these designs may be converted into bucket brigade devices by supplying the appropriate fixed charge regions in the transfer paths which extend under a neighboring electrode in accordance with the well-known bucket brigade concept. In addition it should be clear that the addressing scheme in either horizontal or vertical directions can consist of any number of phases.

Various additional modifications will become apparent to those skilled in the art. All such variations and deviations which basically rely on the teachings through which the invention has advanced the art are properly considered within the spirit and scope of the invention.

What is claimed is:

1. A charge transfer device comprising a charge storage medium the bulk of which is of a first conductivity type, a first insulating layer covering at least a portion of one surface of said medium, a first conductive pattern comprising a series of elongated electrodes disposed parallel to each other extending in a first direction upon said first insulating layer, means under each of said electrodes for preventing the transfer of mobile charge in the medium in said first direction under said electrodes, a second insulating layer overlying said first conductive pattern, a second conductive pattern comprising a series of elongated electrodes disposed over said second insulating layer parallel to each other extending in a second direction which is noncollinear with said first direction, each of said electrodes overlying the first conductive pattern at certain areas and overlying said storage medium in the area between said first conductive pattern, the electrodes of said second conductive pattern defining transfer paths for movement of mobile charge carriers in the medium in said first direction in the spaces between the electrodes of the first conductive pattern extending substantially the length of the electrodes of the first conductive pattern and the electrodes of the first conductive pattern defining transfer paths in the medium in said second direction extending substantially the length of the electrodes of said second conductive pattern, and means for sequentially biasing a series of electrodes of one of said conductive patterns to transfer charge carriers in one of said noncollinear directions while biasing the other conductive pattern so as to form blocking potentials to movement of charge carriers in the other of said noncollinear directions.

2. The device according to claim 1 wherein the electrodes in one conductive pattern are disposed orthogonal to the electrodes of the other conductive pattern.

3. The device according to claim 1 wherein one of said conductive patterns comprises a set of electrodes coupled to a common conduction path and positioned so that biasing said set of electrodes in sequence with the remainder of said electrodes in said conductive pattern moves mobile charge carriers in one of said directions and biasing said set of electrodes in sequence with the electrodes of the other conductive pattern moves charge carriers in the other of said directions.

4. The device according to claim 1 further comprising a region of fixed charge of opposite conductivity type formed in the storage medium over a substantial portion of the said one surface of said storage medium for establishing a fixed surface potential in the storage medium in areas of the transfer paths not covered by electrodes of either conductive patterns.

5. The device according to claim 1 further comprising localized surface regions formed in said medium included in the transfer paths in at least one of said directions for establishing an asymmetric potential along the transfer paths to provide directionality of the movement of carriers in said transfer paths.

6. The device according to claim 5 wherein the localized surface regions comprise strips of fixed charge regions in the medium of the same conductivity type as that of the storage medium disposed under a portion of each electrode in a conductive pattern and under the spaces between said electrodes.

7. The device according to claim 1 further comprising input means adjacent to one end of a first transfer path in one of said directions for serial read-in of mobile charge carriers and output means adjacent to the opposite end of each transfer path in the same direction for parallel readout of said charge carriers.

8. The device according to claim 1 further comprising input means adjacent to one end of each transfer path in one of said directions and output means adjacent to one end of each transfer path in the other of said directions.

9. The device according to claim 1 wherein the means for biasing the electrodes comprises a first conduction path coupled in common to all electrodes in one of said conductive patterns and a second conduction path coupled in common to all electrodes in the other conductive pattern.

10. The device according to claim 1 wherein a series of electrodes of one conductive pattern comprises a plurality of sets of two electrodes with a wider space separating said sets than the space separating the two electrodes in a set.

11. The device according to claim 1 wherein the means for preventing the transfer of mobile charge carriers in said first direction under the electrodes of said first conductive pattern comprise regions of fixed charge of a first conductivity type formed in the storage medium in the portions of said medium beneath the area where the electrodes of one conductive pattern extend over the electrodes of the other conductive pattern.

* * * * *